United States Patent
Gulati et al.

(10) Patent No.: US 7,339,512 B2
(45) Date of Patent: Mar. 4, 2008

(54) ANALOG-TO-DIGITAL CONVERTER WITHOUT TRACK-AND-HOLD

(75) Inventors: Kush Gulati, Waltham, MA (US); Carlos Muñoz, Chelmsford, MA (US); Anurag Pulincherry, San Diego, CA (US); Mark Peng, Cambridge, MA (US)

(73) Assignee: Edgewater Computer Systems, Inc., Kanata, Ontario (CA)

( * ) Notice: Subject to any disclaimer, the term of this patent is extended or adjusted under 35 U.S.C. 154(b) by 0 days.

(21) Appl. No.: 11/475,721

(22) Filed: Jun. 27, 2006

(65) Prior Publication Data

US 2007/0035432 A1   Feb. 15, 2007

Related U.S. Application Data

(63) Continuation of application No. 11/397,345, filed on Apr. 3, 2006, which is a continuation of application No. 11/226,897, filed on Sep. 14, 2005.

(60) Provisional application No. 60/611,025, filed on Sep. 17, 2004, provisional application No. 60/611,053, filed on Sep. 17, 2004.

(51) Int. Cl.
*H03M 1/12* (2006.01)

(52) U.S. Cl. ............... 341/172; 341/122; 341/155

(58) Field of Classification Search ............... 341/155, 341/161, 122, 172
See application file for complete search history.

(56) References Cited

U.S. PATENT DOCUMENTS

| | | | | |
|---|---|---|---|---|
| 5,416,485 A | * | 5/1995 | Lee | 341/172 |
| 6,366,230 B1 | * | 4/2002 | Zhang et al. | 341/162 |
| 6,396,429 B2 | * | 5/2002 | Singer et al. | 341/155 |
| 6,784,824 B1 | * | 8/2004 | Quinn | 341/172 |
| 6,801,151 B1 | * | 10/2004 | Opris | 341/161 |
| 6,967,611 B2 | * | 11/2005 | Atriss et al. | 341/172 |
| 7,009,549 B1 | * | 3/2006 | Corsi | 341/161 |
| 7,026,968 B1 | * | 4/2006 | Ali | 341/120 |
| 7,095,354 B2 | * | 8/2006 | Harrison et al. | 341/159 |
| 7,113,117 B1 | * | 9/2006 | Pentakota et al. | 341/123 |

OTHER PUBLICATIONS

Mehr and Singer, "A 55-mW, 10-bit 40-Msample/s Nyquist-Rate CMOS ADC," *IEEE J. of Solid-State Circuits*, 35(3) Mar. 2000.

Chiu, et al., "A 1.8V 14b 10MS/s Pipelined ADC in 0.18um CMOS with 99dB SFDR," *International Solid-State Circuits Conference*, Feb. 2004.

Sumanen L., "*Pipeline Analog-to Digital Converters for Wide-Band Wireless Communications*", PhD Thesis, Dept. of Electrical and Comm. Eng. Of Helsinki University of Technology, Dec. 13, 2002.

* cited by examiner

*Primary Examiner*—Linh V. Nguyen
(74) *Attorney, Agent, or Firm*—Hamilton, Brook, Smith & Reynolds, P.C.

(57) ABSTRACT

A system and method for converting an analog signal to a digital signal is provided. The analog to digital conversion is achieved without a dedicated sample-and-hold circuit. An ADC stage, preferably the front-end stage in the case of a pipeline ADC, samples the input voltage within a quantizer and within a residue generator. The sampling is performed with associated clocking signals and with switch capacitors also fulfilling the comparison with threshold voltages, within the quantizer and the generation of a residue signal within the residue generator.

7 Claims, 10 Drawing Sheets

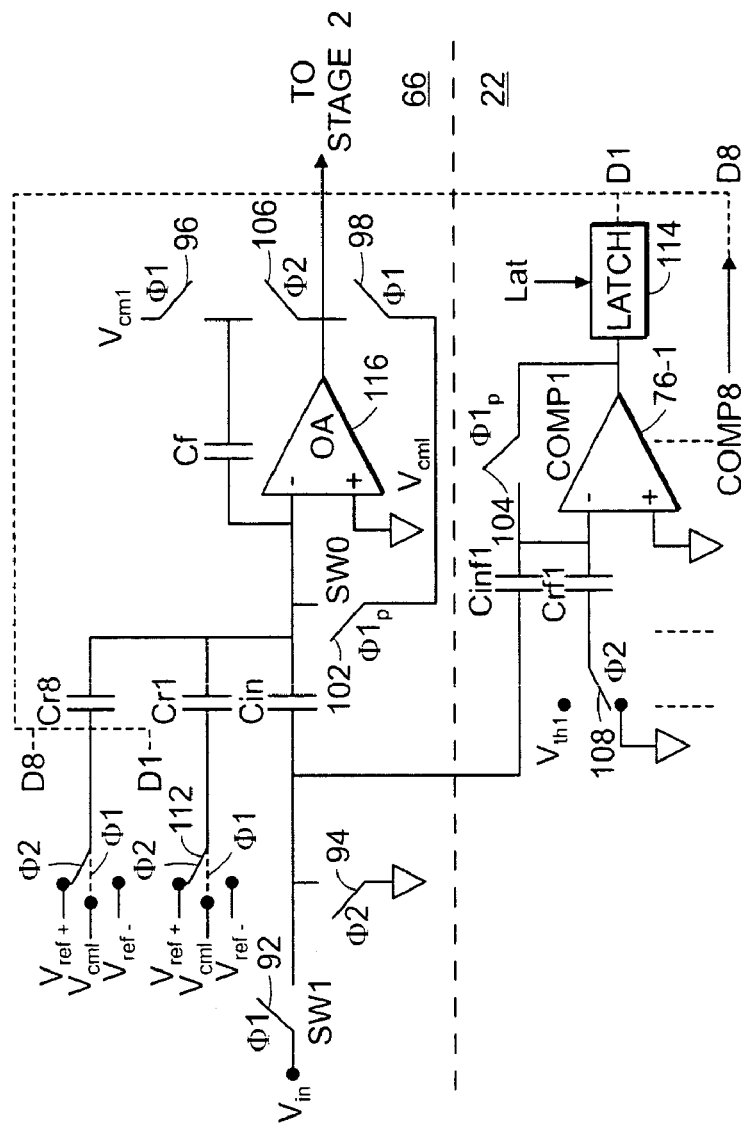
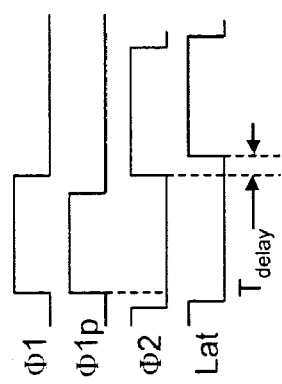
FIG. 5A
FIG. 5B

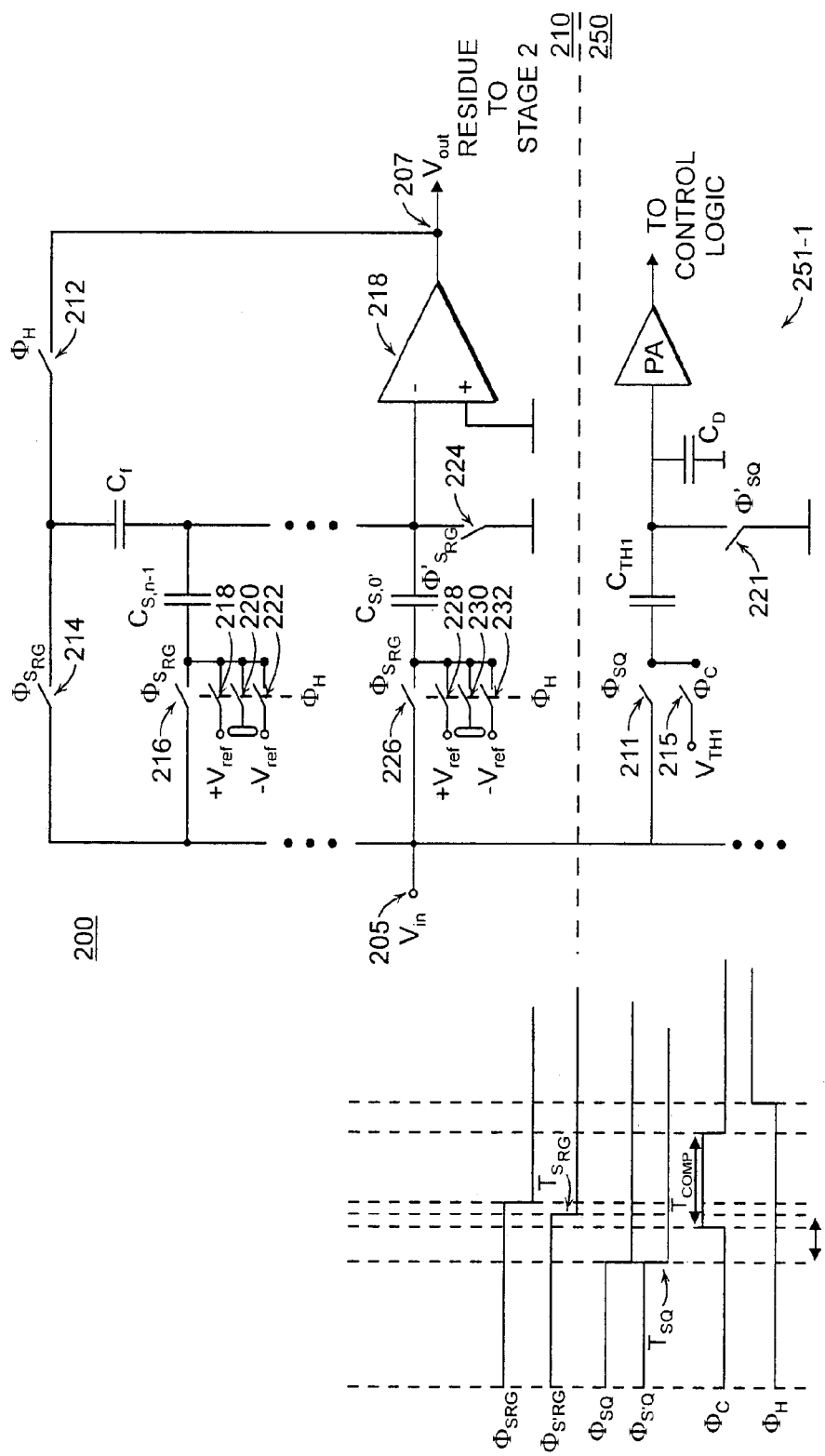

ANALOG-TO-DIGITAL CONVERTER WITHOUT TRACK-AND-HOLD

RELATED APPLICATIONS

This application is a continuation of U.S. application Ser. No. 11/397,345, filed Apr. 3, 2006, which is a continuation of U.S. application Ser. No. 11/226,897, filed Sep. 14, 2005, which claims the benefit of U.S. Provisional Application No. 60/611,025, filed on Sep. 17, 2004 and U.S. Provisional Application No. 60/611,053, filed on Sep. 17, 2004. The entire teachings of the above applications are incorporated herein by reference

BACKGROUND OF THE INVENTION

A recent trend in communication transceivers in applications such as wireless LAN and cable-modem is to digitize multiple channels with a single Analog-to-Digital Converter. A multi-channel wireless LAN system requires Nyquist sampling of input frequencies above 70 MHz with effective number of bits in the order of 10-bits.

There are quite a few architectures which could be used to implement high-resolution (i.e., 10-bit or greater) ADCs. Pipeline architectures are known to use less power than the other architectures, but at the expense of conversion latency. In pipeline converters, power consumption can be optimized by an appropriate selection of bits per stage and capacitor scaling down the pipeline. Also, pipeline architectures are successfully implemented in CMOS using switched capacitor designs, which make them easy to integrate. Speed can be improved through the use of various parallel blocks through the pipeline.

A general block diagram of a state-of-the-art pipeline ADC is shown in FIG. 1. It consists of P low-resolution stages, delay elements synchronizing the stage outputs, and digital correction logic. Each stage has a resolution of Bi+ri bits, of which Bi represents the effective stage resolution and ri the redundancy for a comparator offset correction algorithm. Each stage digitizes the residue of the previous stage, so accordingly, the digital output $B_1$ of the first stage contains the most significant bits (MSBs) while the output $B_p$ of the last stage contains the least significant bits (LSBs). The stages operate concurrently; that is, at any time, the first stage operates on the most recent sample while all other stages operate on residues from previous samples. Serial stages operate in opposite clock phases.

FIG. 2A illustrates a block diagram for a first typical architecture for a residue stage of a typical prior art pipelined ADC 10. An input signal Vin is applied at input node 12. Within the stage, this node is connected to the input of a quantizer 14 and a (usually switched-capacitor) residue generator 16. The quantizer is typically an analog-to-digital converter such as a flash converter. The output of the quantizer 14 is a digital representation of the input signal, usually of only a few bits resolution. A DAC 18 in the residue stage generates a corresponding analog signal representing the quantizer output, and supplies this analog signal to a summer 22. At substantially the same time as the quantizer samples the analog input signal, in response to a clock signal applied at 24, a sample-and-hold (S/H) circuit 26 acquires and holds a sample of the input signal and supplies that held value to the summer 22. Summer 22 forms a difference signal representing the difference between the sampled input signal from the S/H circuit and the approximated input signal reproduction at the output of DAC 18. The resulting difference, or error, signal at 28 is preferably amplified by an amplifier 30 to scale the output residue signal at 32 to take advantage of the dynamic range of the next stage in the pipeline.

For each pipeline ADC stage, the accuracy of the residue generation (and, thus, of the whole converter) is highly dependent on the S/H circuit 23 and the quantizer 22 sampling the input signal at the same time. If there is too large a difference in the timing of those samples, then the residue signal ceases to represent the difference between the input signal at an instant and the ability of the quantizer and DAC to reproduce that input signal value. Hence the next stage will be presented with an error signal beyond its range of ability to correct for the initial conversion inaccuracy.

In order to provide a stable DC input for high-frequency signals, traditionally, most converters, including pipeline ADC's, make use of a dedicated front-end S/H circuit, between the input signal and node 12, as shown in FIG. 2B. S/H circuit 34 is clocked (i.e., takes its sample) half a clock cycle from S/H circuit 26 and quantizer 14. With this arrangement, input to the node 12 is not moving when it is sampled, so there is no risk that the quantizer and residue stage will sample different values of the waveform. In many implementations of the track-and-hold stage, a passive switched-capacitor sampling is utilized. A track-and-hold circuit adds noise at the signal input as well as consumes power. To account for the higher noise floor because of the noise injection due to the track and hold, the capacitors in the ADC stages have to be increased in size to reduce the thermal noise from these stages. This leads to a large increase in power consumption of the overall ADC.

Recently, ADC implementations without explicit S/H amplifiers have been demonstrated at the sub-50MSPS sampling rates. "A 55-mW, 10-bit 40-Msample/s Nyquist-Rate CMOS ADC," IEEE J. of Solid-State Circuits, Vol. 35, No. 3, March 2000, of Mehr and Singer, also disclosed in U.S. Pat. No. 6,396,429 and "A 1.8V 14b 10MS/s Pipelined ADC in 0.18 um CMOS with 99 dB SFDR," International Solid-State Circuits Conference, February 2004 of Chiu et. Al, are two such converters. However, both implementations do not satisfy the sampling rates requirements of many current applications.

Traditionally, an MDAC within a pipeline ADC stage is implemented using the switched capacitor (SC) technique, the core of the MDAC being essentially an SC integrator formed around an operational amplifier, or op-amp. A general unit capacitor MDAC of a Bi+r-bit pipeline stage is presented in FIG. 3 as a single-ended configuration for simplicity. The analysis below is based on the unit capacitor MDAC, but can be easily expanded for other MDAC topologies. The SC unit capacitor MDAC comprises 2Bi unit capacitors (Cs,0 ... Cs,n−1 and Cf), switches that operate in the sample ($\phi_S$) or hold ($\phi_H$) phase, and an operational amplifier. During the sample phase $\phi_S$, the bottom plates of all the unit capacitors (Cs,0 ... Cs,n−1 and Cf), are connected to the stage input voltage Vin, i while the top plates of the capacitors are grounded through one switch. The so-called bottom-plate sampling can be employed by opening the common sampling switch to the ground in phase $\phi_S'$, slightly before the input connecting switches in phase $\phi_S$. After entering the hold phase $\phi_H$, the bottom plate of the feedback capacitor $C_f$ is connected to the operational amplifier output, while the sampling capacitors Cs,0 ... Cs,n−1 are set to $-V_{ref}$, 0, or $+V_{ref}$ depending on the output of the sub-ADC.

FIGS. 4, 5A and 5B illustrate the ADC design disclosed within U.S. Pat. No. 6,396,429 of Singer and Mehr, without an explicit S/H in front of Stage 1 of a pipeline ADC. In FIG.

4, an eight-stage pipelined converter based on the Singer and Mehr implementation, is shown. A first stage 62 has a quantizer 64 and a residue generator 66. This first stage samples the analog input signal Vin supplied at 68 and generates a residue signal at 70 for the next stage. There is no S/H interposed between the analog input signal and the first stage of the pipeline converter. However, a sampling operation is distributed inside first stage 62 to both the residue generator and the quantizer, as follows: An explicit sample and hold (S/H) 72 within the residue generator 66, and a flash converter 74, which provides the quantizer function, are connected in parallel to the input 68 and sample directly the input voltage Vin. More particularly, flash converter 74 includes a number (such as eight) comparators 76-1 through 76-n, each of which has an input connected to the input of the flash converter 74 via an explicit sample-and-hold (S/H) circuit 77. Singer and Mehr mention that alternatively, and preferably, the function of S/H 77 can be moved into each of the comparators 76-i, allowing the S/H 72 and the comparators 76-i inside the first stage 62 to sample directly the input voltage.

Within the circuit of FIG. 4, given the parallel sampling of the input signal on the MDAC and the quantizer, aperture errors, must be minimized in order to obtain good dynamic performance, particularly in the presence of high frequency signals input. This is achieved by matching the sampling networks for the (DAC) residue generator and the quantizer comparators in terms of topology and time constants.

An exemplary arrangement for the first stage 62 of an ADC according to the Singer and Mehr design is shown in FIG. 5A. Associated switch control signals are shown in FIG. 5B. The op-amp and switching network comprising residue generator 66 is shown on top of one out of the eight flash comparators 76-1, the other comparators being similarly configured and connected. During the tracking phase when φ1p is asserted, switches 92, 96, 98, 102 and 104 are closed and as signal φ2 is de-asserted, switches 94 and 106 are open; switch 108 is a single-pole, double throw switch thrown to the ground position when φ2 is asserted and to a reference voltage Vth1 otherwise. At the inverting input node to op-amp 116 there are connected one terminal each of switch 102, input sampling capacitor Cin, feedback capacitor Cf and reference capacitors Cr1 through Cr8. Each of the reference capacitors, such as capacitor Cr1, has another terminal connected to the pole of a single-pole, triple-throw switch 112; one throw is connected to a positive reference voltage, Vref+, one throw is connected to a negative reference voltage, Vref−, and one throw is connected to a common mode voltage, Vcm1. When φ1 is asserted, switch 112 is thrown to its middle position, connecting to the Vcm1 throw; when φ2 is asserted and the output D1 of the first comparator 76-1 is high, switch 112 is thrown to the Vref+ position; when φ2 is asserted and the output D1 of the first comparator 76-1 is low, switch 112 is thrown to the Vref− position. In the tracking phase, both capacitors Cin and each of Cinf1 through Cinf8 and are charged and track the input voltage. The sampling operation in the DAC occurs when switch 102 opens on the falling edge of φ1p. The sample is taken relative to common-mode voltage Vcm1 rather than around the op-amp 116. The sampling operation inside the flash comparators occurs on the same falling edge of φ1p when switch 104 opens. At this time, the comparator preamplifiers are also auto-zeroed. Separate reference capacitors (Cri in the DAC and Crfi in the flash converter, where i is an index variable) are required to accommodate the input common-mode range. The reference voltages for the comparators are sampled on the falling edge of φ1, as well. At this moment, the input voltage Vin is sampled and available on capacitors Cinfi, while corresponding reference voltages Vthi are sampled and available on Crfi. After the rising edge of φ2, the difference Vin-Vthi is sensed at the summing junction at the inverting inputs of the comparators. Meanwhile, the DAC transitions to the amplify phase (while φ2 is asserted) although the decision from the flash is not available yet. After a short delay $T_{delay}$ from the rising edge of the φ2 signal, which is necessary to allow the difference between the input and the references to be amplified inside the comparators, the latching signal Lat occurs and the comparator decision outputs D1-D8 become available to the DAC (after the latch 114 regenerates).

Considering now FIGS. 3 and 5A, it can be seen that compared to the traditional SC MDAC stage depicted in FIG. 3, in the Singer and Mehr implementation, the elimination of the dedicated S/H stage before the front stage requires an explicit input tracking capacitor Cin within the multiplying digital-to-analog converter (MDAC) stage, along with "replica" tracking switched capacitors for each comparator Cr1-Cr8. The presence of a dedicated input capacitor in the MDAC in addition reference capacitors leads to a large reduction of feedback factor of the MDAC opamp during the amplify phase. A reduced feedback factor MDAC opamp will limit the maximum sampling rate achievable and/or will burn extra power in the first stage.

SUMMARY OF THE INVENTION

A system and method for converting an analog signal to a digital signal is provided. In certain embodiments, the system comprises an input to receive an input analog signal, a quantizer and a residue generator. The quantizer has at least one comparator subcircuit, the comparator subcircuit having a threshold capacitor switch coupled to the input, for sampling the input analog signal during a quantizer sampling phase. The threshold capacitor is also connected to a threshold voltages, during a comparison period, for comparing the quantizer sampled input analog signal to the threshold voltages. The quantizer produces a digital output signal.

The residue generator is coupled to the quantizer, usually via control logic, and comprises a plurality of reference capacitors and a feedback capacitor. The reference capacitors and the feedback capacitor are switch coupled to the input analog signal, for sampling the input analog signal during a reference generator sampling phase. The reference capacitors are also switch coupled to a plurality of reference voltages during an amplify phase. Furthermore, during the amplify phase, the feedback capacitor wraps around an op-amp. A residue analog output signal is thus produced. The residue generator sampling characteristics substantially match quantizer sampling characteristics, for avoiding wide and missing codes due to aperture errors.

According to an aspect of the invention, the difference between the residue generator sampling edge and the quantizer sampling edge, $\Delta T$ should be less than $Tskew=1/(2^{n+2} \pi Fmax)$, where Fmax is the maximum frequency of the analog input signal.

According to a preferred embodiment of the invention, a pipeline analog-to-digital converter would comprise a front end stage implemented according to the present invention and subsequent stages, implemented in a state-of-the art fashion. This would advantageously allow a pipeline ADC to operate without a dedicated sample-and-hold (S/H) circuit before its front end stage.

BRIEF DESCRIPTION OF THE DRAWINGS

The foregoing will be apparent from the following more particular description of example embodiments of the invention, as illustrated in the accompanying drawings in which like reference characters refer to the same parts throughout the different views.

The drawings are not necessarily to scale, emphasis instead being placed upon illustrating embodiments of the present invention.

FIG. 5A is a circuit representation of the ADC front-end of FIG. 5;

FIG. 5B is a clocking diagram for the circuit in FIG. 6A;

FIG. 6A is a circuit representation of an ADC from-end according to an aspect of the present invention;

FIG. 6B is a clocking diagram for the circuit in FIG. 6A;

DETAILED DESCRIPTION OF THE INVENTION

Figure 1:
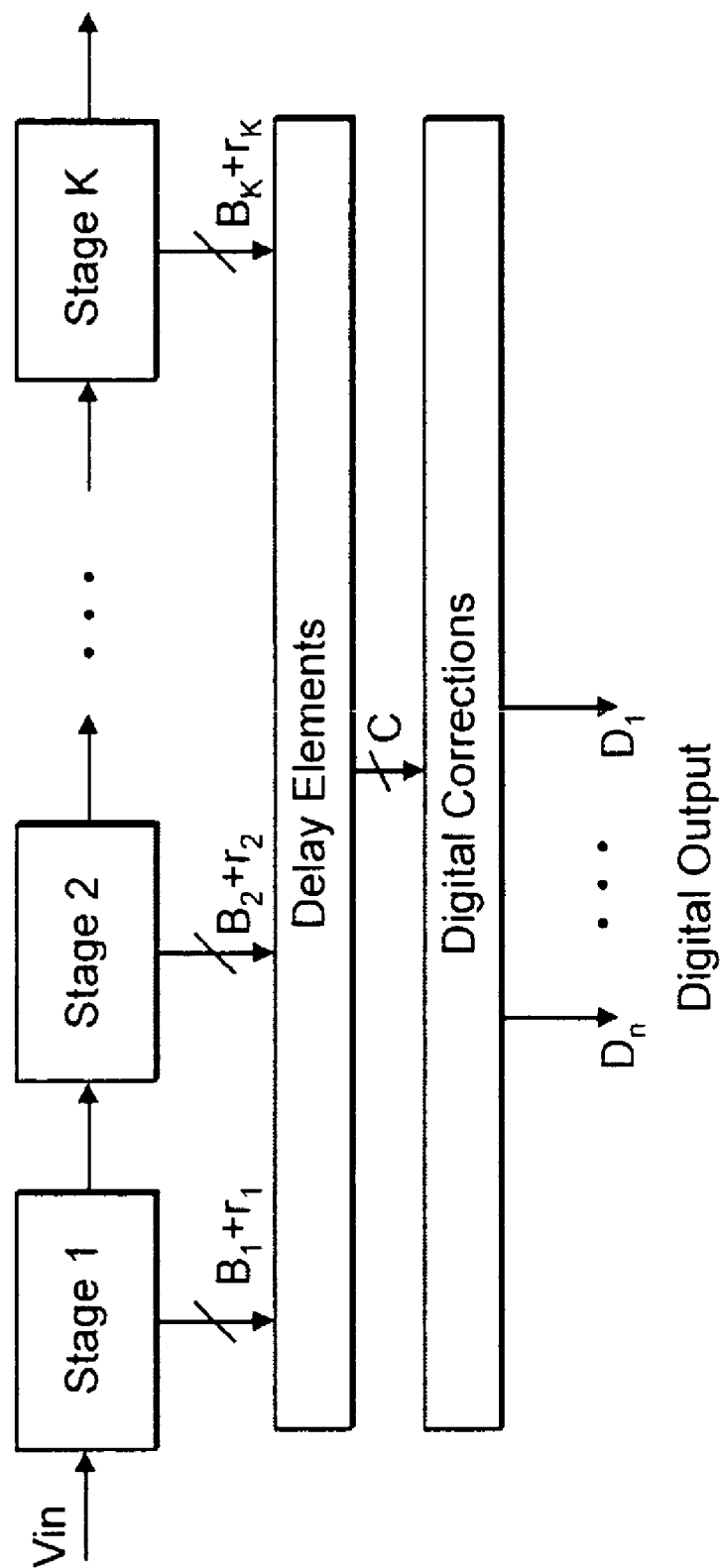
FIG. 1 is a block diagram of a state-of-the-art pipeline analog-to-digital converter.
Figure 2A:
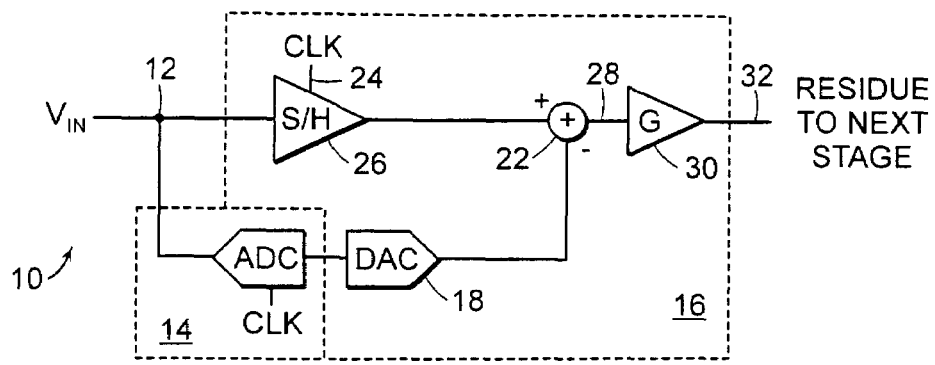
FIGS. 2A and 2B are general block diagram of a pipeline ADC stage.
Figure 2B:
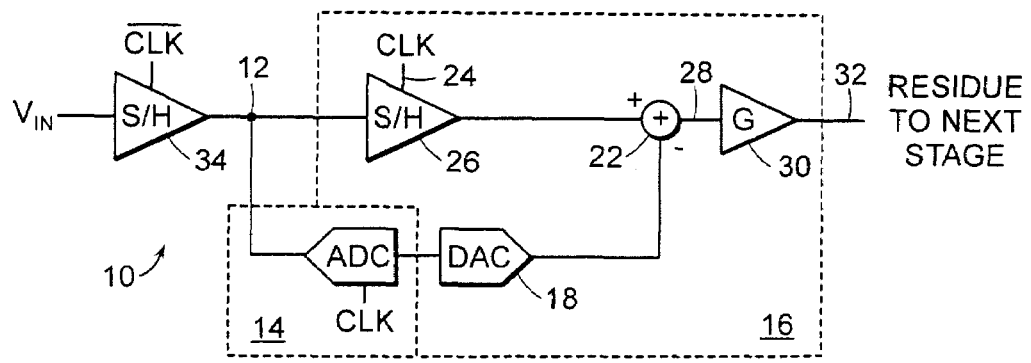

A description of preferred embodiments of the invention follows.

An exemplary arrangement for the first stage 200 of an ADC according to an embodiment of the invention is shown in FIG. 6A. Associated switch control signals are shown in FIG. 6B. According to a preferred embodiment, the ADC 200 is only a substage, preferably the front-end stage, of a pipeline ADC architecture; however, other ADC architectures based on the illustrated ADC 200 are not excluded. The ADC 200 comprises a residue generator 210 and a quantizer 250. The quantizer 250 has a plurality of comparator subcircuits, such as 251-1. For simplicity, only one comparator stage is shown, with the understanding that remaining comparator stages are similarly configured and connected. Comparator subcircuit 252-1 comprises at least a threshold capacitor $C_{TH1}$ selectively coupled to the input, via switch 211, and to the ground (or common-mode), via switch 221, for sampling the input analog signal Vin during a quantizer sampling phase, on the assertion of clocks ($\phi s_Q$, $\phi' s_Q$). The threshold capacitor $C_{TH1}$ is also connected to a predetermined threshold voltage $V_{TH1}$ via switch 215, during a comparison period $T_{COMP}$, for comparing the quantizer sampled input analog signal to the predetermined threshold voltages. Based on such comparisons carried within each comparator subcircuit, the quantizer produces a quantized digital output version of the analog input signal. In addition to sending the digital output signal to a digital correction block, from obtaining a number of most-significant-bits (MSB) corresponding to the analog input signal, digital outputs from the quantizer are sent to control logic determining appropriate settings for switches within the residue generator, as further explained.

The residue generator 210 is coupled to the quantizer, usually via control logic, and comprises a plurality of reference capacitors $C_{s,0}$ to $C_{s,n-1}$ and a feedback capacitor, $C_f$. The residue generator or MDAC 201 is very similar to state-of-the-art MDAC shown in FIG. 3, the core of the MDAC being essentially an SC integrator formed around an operational amplifier 208. A single-ended configuration is illustrated for simplicity, but the topology could be fully differential. The reference capacitors $C_{s,0}$ to $C_{s,n-1}$ and the feedback capacitor $C_f$ are switch coupled to the input analog signal via switches 241, 216, . . . 226, for sampling the input analog signal during a reference generator sampling phase, on the assertion of clocks ($\phi_{SRG}$, $\phi'_{SRG}$) Specifically, during the residue generator sampling phase $\phi_{SRG}$, switches 214, 216, . . . 226 close, allowing the bottom plates of all the reference capacitors and of the feedback capacitor to connect to the input voltage Vin, while the top plates of the capacitors are grounded through switch 224. The so-called bottom-plate sampling can be employed by opening the common sampling switch 224 to the ground in phase $\phi'_{SRG}$, slightly before the input connecting switches in phase $\phi_{SRG}$. The actual sampling edge is the falling edge of the clock $\phi'_{SRG}$. After entering the hold phase $\phi_H$, the bottom plate of the feedback capacitor $C_f$ is connected to the operational amplifier 208 output 207, by closing switch 212, while the reference or sampling capacitors $C_{s,0}$ to $C_{s,n-1}$ are set to $-V_{ref}$, 0, or $+V_{ref}$ depending on the output of the quantizer unit, by appropriately closing the associated switches, out of 218, 220, 222, . . . 228, 230, 232. A residue analog output signal representing the difference between the input analog signal and the analog equivalent of the digital signal outputted by the quantizer is produced.

Figure 3:
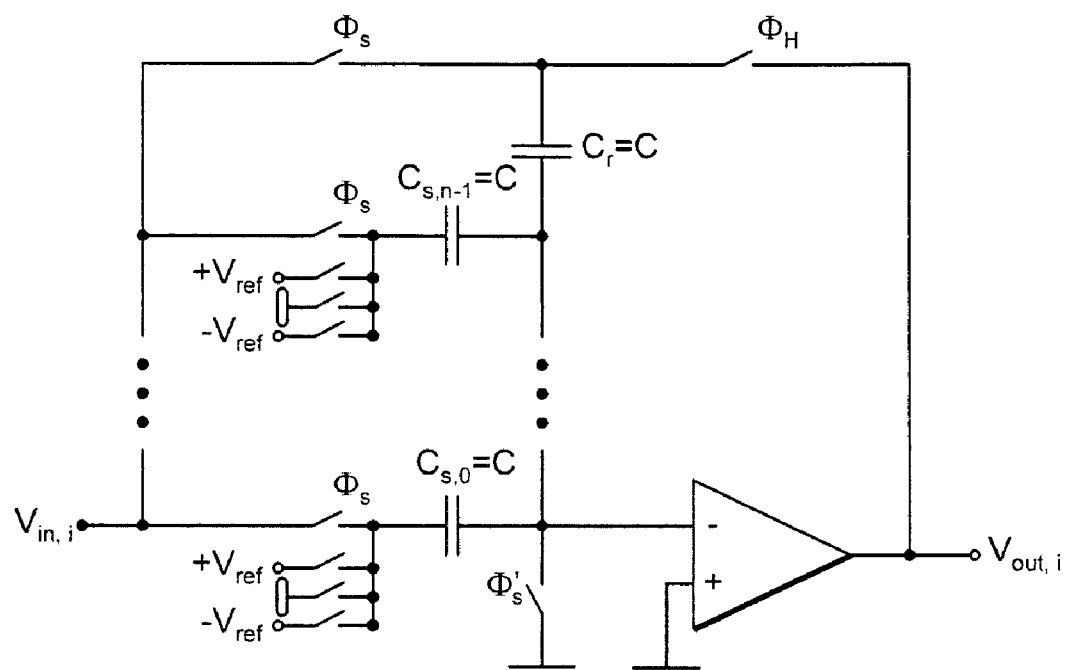
FIG. 3 is a general block diagram of a state-of-the-art switched capacitor (SC) implementation of a Multiplying Digital to Analog Converter (MDAC) block within a pipeline ADC stage.

One can observe that component-wise the state-of-the-art MDAC of FIG. 3 is very similar to the MDAC or residue generator 200 of FIG. 6A. The difference resides in the relation of the clocking signals associated with the operation of the residue generator with respect to the clocking signals associated with the operation of the quantizer, as explained below.

In contrast to the prior art, it has to be noted that the quantizer 250 operates on a different sample of the input signal than the residue generator 210, permitting thus operation without a dedicated sample-and-hold circuit. The residue generator 210 sampling characteristics are required to substantially match quantizer 250 sampling characteristics, for avoiding wide and missing codes due to aperture errors. The exact sampling instants for both residue generator and the quantizer, $T_{RG}$ and $T_Q$, respectively, are determined by the falling edge $\phi'_{SRG}$ of $\phi'_{SQ}$, respectively. Any timing difference $\Delta T$ between these sampling edges will result in a corresponding voltage mismatch and may lead to wide and missing codes, if greater than the quantizer resolution. In order to avoid such non-idealities, the maximum timing difference $\Delta T$ must be less than or equal to Tskew, where Tskew corresponds to the maximum frequency of the ADC input applied as follows: Fmax=$1/(2^{n+2}*\pi*Tskew)$, where n is the number of bits resolved by the ADC stage. The timing difference between the sampling edges can be minimized by reducing the interconnect length between across the sampling switches.

In addition to the constraint on the timing difference between the sampling edges between the residue generator sampling and the quantizer sampling, the quantizer sampled analog signal must delivered to the comparator preamplifiers during phase $\phi_C$, over a limited time period $T_{COMP}$, indicating that comparators must resolve their decisions prior to the start of the amplifying phase, on assertion of clock $\phi_H$.

According to another aspect of the invention, if Fmax of the input analog signal is low enough, Tskew might be substantially larger than an initially achieved $\Delta T$. Therefore, the quantizer sampling clocks can be advanced in order to allow for a longer comparison period $T_{COMP}$, as much as to lead to a new $\Delta T$, only slightly smaller than Tskew. It will be understood by those skilled in the art that an optimal point, with a sufficient $T_{COMP}$ and also a sufficiently large Fmax, can be searched, based on these principles.

Figure 4:
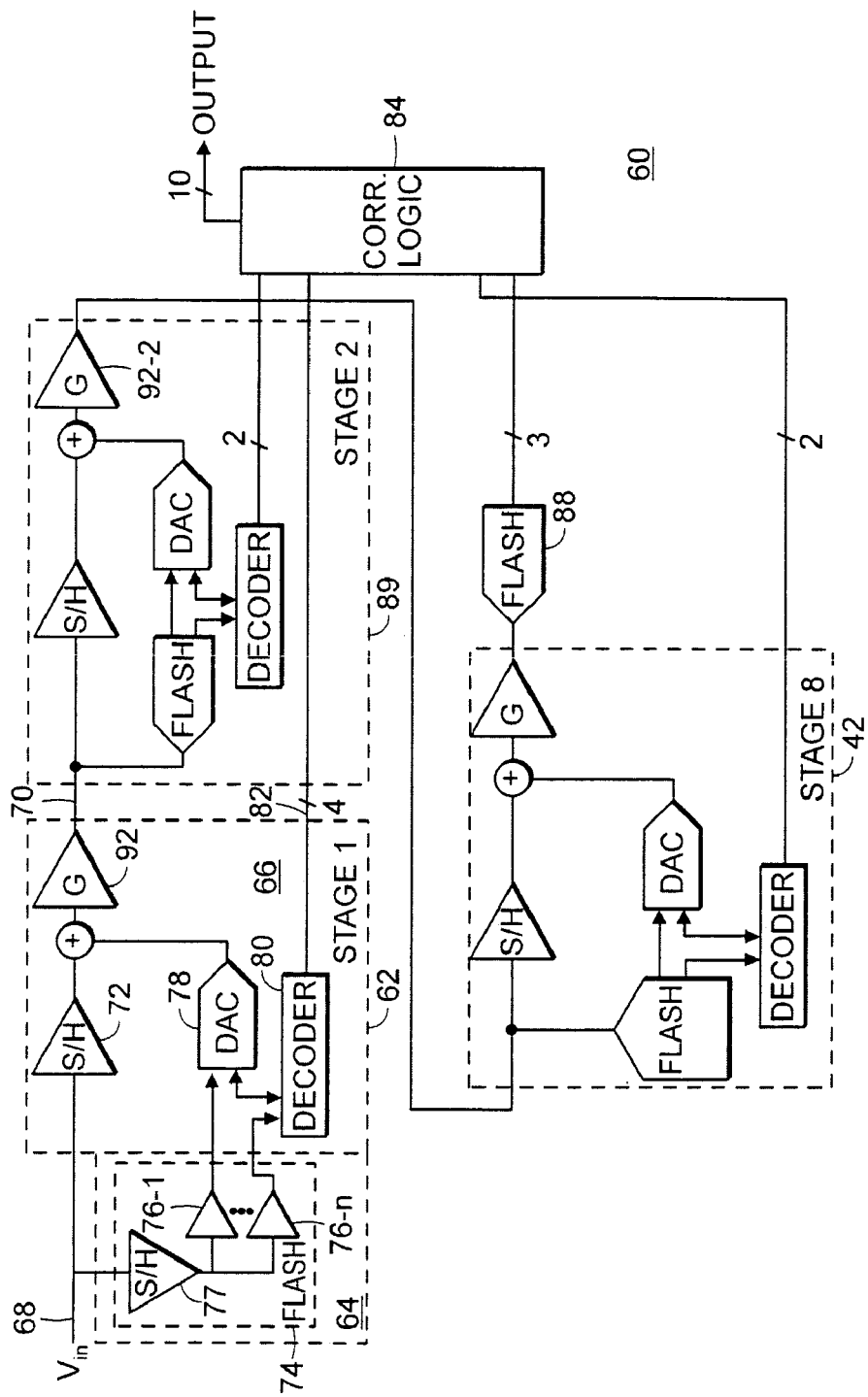
FIG. 4 is a block diagram of a prior-art pipeline ADC, without an dedicated S/H block in front of a first stage of the ADC.

Furthermore, in contrast to the Singer and Mehr implementation as illustrated in FIGS. 4, 5A and 5B, the state-of-the-art implementation of FIG. 3 has been maintained, without adding new components, such as $C_{in}$ in Singer and Mehr. Advantageously, this enables higher sampling rates and even more efficient power consumption, than in the Singer and Mehr implementation.

Figure 7:
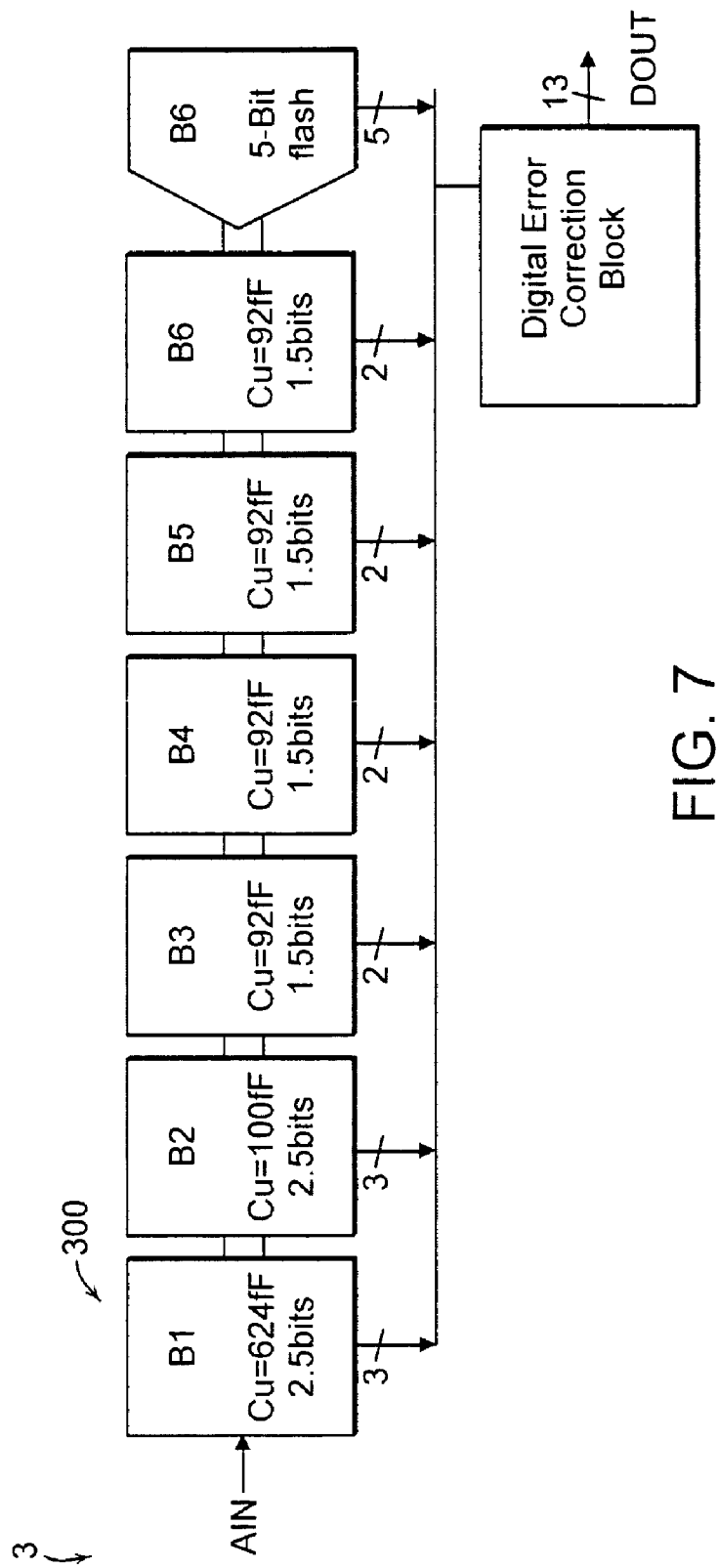
FIG. 7 is a block diagram of a pipeline ADC according to a preferred embodiment of the present invention.

Turning now to FIG. 7, a block diagram of a 13-bit resolution pipeline analog-to digital converter (ADC) 3 according to a preferred embodiment of the invention is illustrated. The 13-bit pipelined system 300 comprises a 2.5-bit first stage 300 that serves as the front-end of the pipe, followed by another 2.5-bit second stage and four 1.5-bit stages, and a 5-bit flash. This distribution of bits/stages is advantageous in order to optimize power consumption. Preferably, the capacitive load and op-amp power consumption in the second stage is scaled down by a factor of 5 with respect to the first stage. A folding residue digital error correction is employed to compensate for comparator errors. The extra quantization inherent in this ADC allows the quantization noise to be lower than the overall thermal or circuit noise, a constraint imposed by a plurality of communication receivers. Depending on design and layout, the 13b according to the preferred embodiment of the invention has 180MSPS, and may present an ENOB (Effective Number of Bits) of 10.5-bits and a THD (Total Harmonic Distortion) of 70 dB without a dedicated track-and-hold. The converter may be fabricated in a 0.25 um nitride-MiM process and may reside on the same substrate with two I/Q 180MSPS, 12-bit current-steering D/A converters.

Figure 8B:
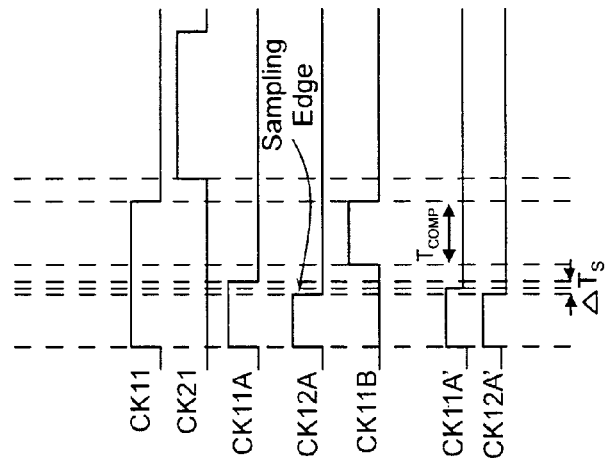
FIG. 8B is a clock diagram for the clocking signal associated with the circuit in FIG. 8A.
Figure 8A:
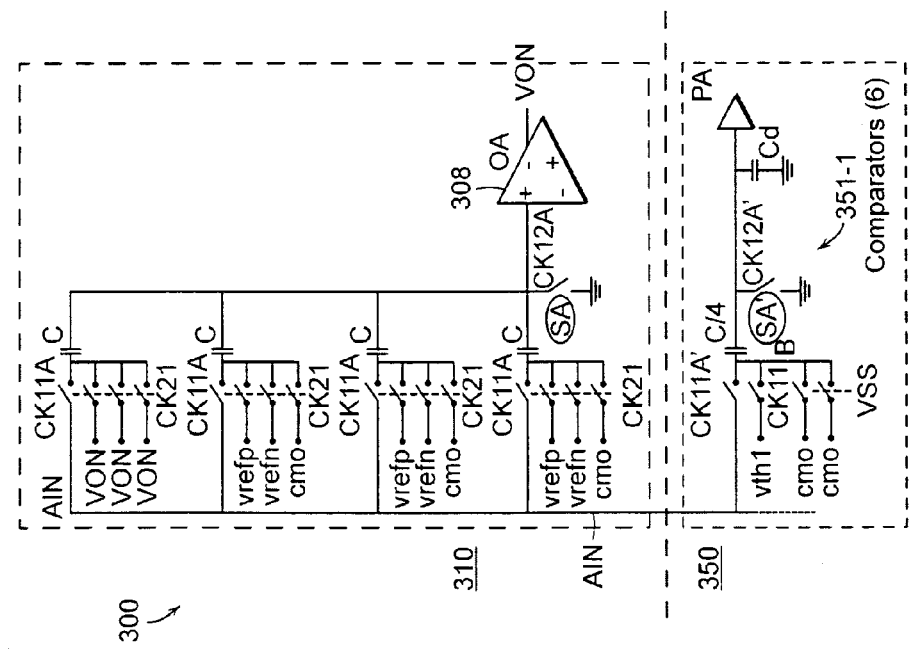
FIG. 8A is a schematic representation of the front-end stage for the circuit in FIG. 7.

Turning now to FIG. 8A, a circuit representation of the 2.5 bit front-end stage 300 of the 13-b ADC 3 in FIG. 7 is illustrated. Associated clocking signals are shown in FIG. 8B. Similarly to the implementation of FIGS. 6A and 6B, within the residue generator or MDAC 310 of the front-end stage, three reference unit capacitors C and a feedback unit capacitor C, track the input during a sampling phase CK11A, with no exclusive sampling capacitor. During the amplify phase, CK21, the feedback capacitor is wrapped around an op-amp 308, while the reference capacitors are connected to the appropriate references, as indicated by comparison with a plurality of threshold voltages, such as vth1, within a quantizer 350, via control logic (not shown). The quantizer 350 comprises six similarly configured and connected comparators subcircuits, such as 351-1, only one of them being shown. In contrast to the prior art case, threshold capacitors within the comparator sample the input during CK11A'. As explained with reference to FIGS. 3 and 6A, the exact sampling instant for both MDAC and comparators is determined by the falling edges of CK12A and CK12A', respectively. In this embodiment, CK12A and CK12A' are derived from the same clock signal, the difference between them being attributed only to propagation delays. Any timing skew between the MDAC (switch SA) and comparator (switch SA') sampling edges will result in a corresponding voltage mismatch and will lead to wide and missing codes. The maximum ADC input that can be applied without inducing these non-idealities is Fmax=$1/(16*\pi*\text{Tskew})$, where Tskew is the MDAC/comparator aperture mismatch. The skew between these edges can be minimized by reducing the interconnect length between across the sampling switches. The sampled analog signal is delivered to the comparator preamplifiers during phase CK11B. This allows the comparators to resolve their decisions prior to the start of the amplifying phase, on the assertion of CK21. In further reference to FIG. 8B, CK11 is the sampling signal for all other stages within ADC 3, except for the first stage 300, which samples as discussed above. Also, CK21 is the amplifying signal for all stages within ADC 3, including the first stage 300.

The charge kick-back that stems from a sampling front-end and its relationship with the input magnitude is an important determinant of the ADC performance. In a conventional single-capacitor T/H implementation, the net input tracking charge required from the circuitry driving the ADC is proportional to the difference between the current sampled value and the previously sampled value or $V_{in}[i]-V_{in}[i-1]$, where 'i' represents the time instant. This distributed sampling MDAC has exactly the same property. The capacitor that is wrapped around the op-amp starts the sampling operation at an initial voltage of Vres[i−1], which equals 4*Vin[i−1]−K[i−1]*Vref, where K varies from −3 to +3 depending on the comparator decision for the previous sample. The other three capacitors start the sampling phase at an effective averaged initial voltage of K[i−1]*Vref. On the net, however, the K[i−1]*Vref term cancels out and the average initial voltage for all four capacitors equals Vin[i−1], much like the conventional one-capacitor T/H. This property allows this circuit to not suffer from any undesirable non-linear memory effects in the front-end.

For a conventional one-capacitor T/H implementation, the gain error in the sampling operation will manifest itself as overall ADC gain error and not distortion, barring non-linear junction capacitance. This distributed sampling MDAC 310 in FIG. 8A has exactly the same property. Mismatch in time-constants across the four path-ways will not degrade performance to the first order. Any mismatch in time-constants across the four capacitors will get averaged out once the charge from the four capacitors is combined at the virtual ground of the op-amp.

The appropriate phasing for CK11A and CK11B may be derived by a low-jitter delay-locked loop. A plurality of delay cells (such as eight) can be employed to allow the possibility of varying the duty cycle of the sampling operation relative to the time allocated to the comparator preamplifiers. Alternatively, the ADC in FIG. 7 can be driven by a clock that is double the sampling rate.

Figure 9B:
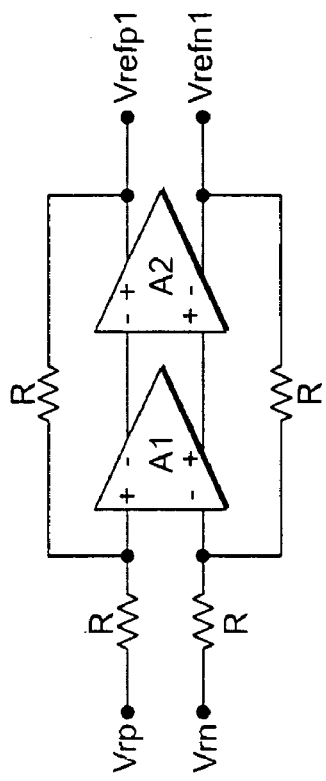
FIGS. 9A and 9B are schematics representations of the circuits used in deriving reference voltages for the circuit in FIG. 8A.
Figure 9A:
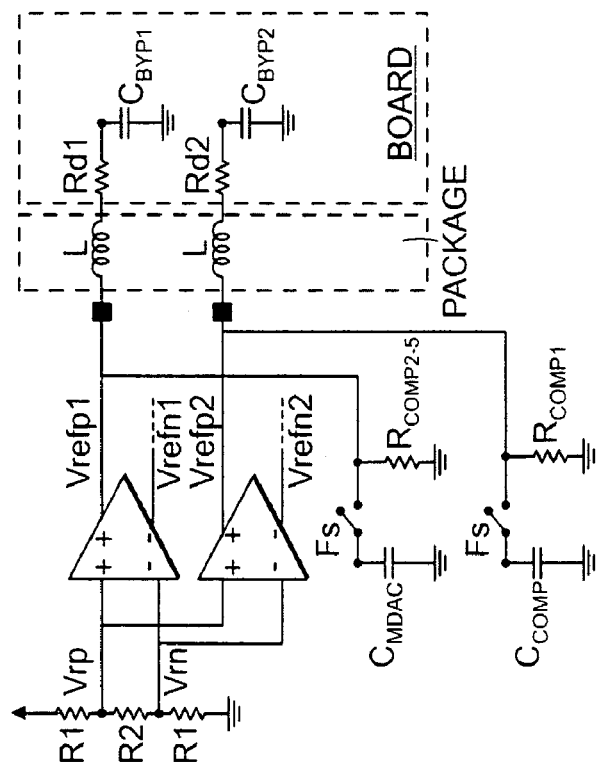
Figure 10:
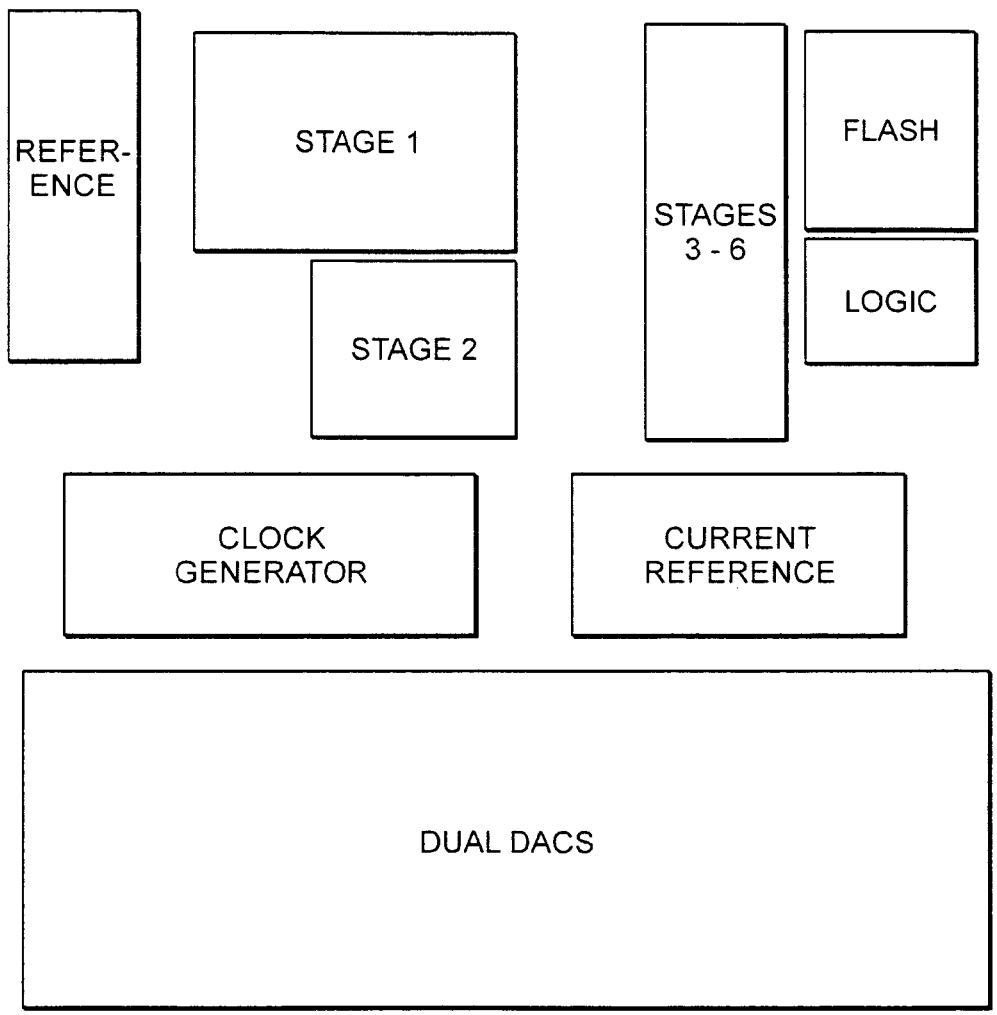
FIG. 10 is a die microphotograph of a CMOS layout for a system comprising the ADC in FIG. 7.

Turning now to FIGS. 9A and 9B, it is illustrated that reference levels for the converter MDAC and comparator capacitors in FIG. 8A can be derived on-chip from a resistor string. Switching the threshold capacitors Cc1-Cc6 to the references during phase CK11B, as shown in FIG. 8, can lead to disturbance of the amplified residues of all even stages in the pipe; this can lead to significant error especially since this event occurs through the middle of the phase. To prevent this from degrading performance, the references for the front-stage or stage 1 comparator are isolated from the primary references connected to the MDAC through the use of the dual isolation buffers. The primary buffer provides references for all the MDAC capacitors and comparators in stages 2 onwards; the secondary buffer just provides the references for the comparators in stage 1. By design and layout, these reference buffers are very well matched in order to ensure that the stage 1 comparators operate on the same reference levels as the rest of the pipe. The implementation of these buffers is also shown in FIG. 9B. It consists of two stages with an overall gain of about 60 dB and very low overall speed. An external capacitor with a series damping resistor provides compensation for the feedback amplifier. The external capacitor also provides the transient charge required by the MDAC capacitors. The feedback amplifiers play no role in reference settling; their primary role is to isolate the kickback from the stage 1 comparators.

While this invention has been particularly shown and described with references to preferred embodiments thereof, it will be understood by those skilled in the art that various changes in form and details may be made therein without departing from the scope of the invention encompassed by the appended claims.

What is claimed is:

1. An analog-to-digital converter comprising:
    an input to receive an input analog signal;
    a quantizer comprising at least one comparator subcircuit, the comparator subcircuit comprising at least a threshold capacitor switch coupled to the input for sampling the input analog signal during a quantizer sampling phase and switch coupled to a threshold voltage for producing a digital output signal based on a comparison of the sampled input analog signal to the threshold voltage during a comparison period; and
    a residue generator coupled to the quantizer, the residue generator comprising a plurality of reference capacitors and a feedback capacitor switch coupled to the input, for sampling the input analog signal during a reference generator sampling phase different from the quantizer sampling phase, said reference capacitors being also switched coupled to a plurality of reference voltages based on settings received from the quantizer during an amplify phase and said feedback capacitor wrapping around an op-amp during said amplify phase, for producing a residue analog output signal, residue generator sampling characteristics substantially matching quantizer sampling characteristics.

2. The converter as claimed in claim 1, wherein a degree of matching of the sampling characteristics is selected at least in part based upon an expected frequency range of the input signal.

3. A method of converting an input analog voltage into a digital voltage comprising:
    within a quantizer, using a plurality of threshold capacitors switch coupled to an input for sampling the input analog voltage during a quantizer sampling phase and switch coupled to a plurality of threshold voltages for comparing the threshold voltages with the sampled input analog voltage; and
    within a residue generator connected to the quantizer, using a plurality of reference capacitor switch coupled to the input for sampling the input analog voltage during a residue generator sampling phase different from the quantizer sampling phase and switch coupled to a plurality of reference voltages in response to settings received from the quantizer for producing a residue signal, residue generator sampling characteristics substantially matching quantizer sampling characteristics.

4. The method as claimed in claim 3 wherein the sampling characteristics are matched at least in part based upon an expected frequency range of the input analog voltage signal.

5. The analog-to-digital converter of claim 3 wherein the matched sampling characteristics include the bandwidths of the sampling networks.

6. A pipelined analog-to-digital converter comprising a first stage, one or more intermediate stages each of which receives as input a residue signal output from an immediately preceding stage, a final stage which converts a residue output signal from a next-to-final stage into a corresponding digital signal and correction logic which receives each stage's output and generates a corresponding digital word; and at least the first stage being an analog-to-digital converter according to claim 1.

7. The analog-to-digital converter of claim 6, wherein the analog-to-digital converter is selected from among a pipeline converter, a cyclic converter, a pipeline sigma-delta converter, an error-correcting successive approximation converter, and a two-step converter.

* * * * *